United States Patent
Yoneda

(10) Patent No.: US 7,144,829 B2
(45) Date of Patent: Dec. 5, 2006

(54) METHOD FOR FABRICATING SEMICONDUCTOR DEVICE AND SEMICONDUCTOR SUBSTRATE

(75) Inventor: Kenji Yoneda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/822,722

(22) Filed: Apr. 13, 2004

(65) Prior Publication Data

US 2005/0026461 A1 Feb. 3, 2005

(30) Foreign Application Priority Data

Jul. 29, 2003 (JP) .............................. 2003-281453

(51) Int. Cl.
*H01L 21/26* (2006.01)

(52) U.S. Cl. ............... 438/795; 438/474; 257/E21.056; 257/E21.537; 257/E21.679

(58) Field of Classification Search ................ 438/795, 438/473, 474; 257/E21.056, E21.537, E21.574, 257/E21.644, E21.679, E27.01

See application file for complete search history.

(56) References Cited

U.S. PATENT DOCUMENTS

| | | | |
|---|---|---|---|
| 4,868,133 A | * | 9/1989 | Huber .................... 438/471 |
| 4,994,399 A | * | 2/1991 | Aoki ..................... 438/473 |
| 5,403,406 A | * | 4/1995 | Falster et al. .............. 148/33.2 |
| 5,453,385 A | * | 9/1995 | Shinji .................... 438/143 |
| 5,674,756 A | * | 10/1997 | Satoh et al. ................ 438/471 |
| 5,795,809 A | * | 8/1998 | Gardner et al. ............. 438/402 |
| 5,951,755 A | * | 9/1999 | Miyashita et al. ........... 117/89 |
| 6,261,860 B1 | | 7/2001 | Nagata |
| 2003/0157814 A1 | | 8/2003 | Lida et al. |
| 2004/0171234 A1 | * | 9/2004 | Takeno .................... 438/471 |

FOREIGN PATENT DOCUMENTS

| JP | P3011178 | 12/1999 |
|---|---|---|
| WO | WO 02/097875 A1 | 5/2002 |
| WO | WO 03/009365 A1 * | 1/2003 |

* cited by examiner

*Primary Examiner*—Caridad Everhart
(74) *Attorney, Agent, or Firm*—McDermott Will & Emery LLP

(57) ABSTRACT

A first thermal treatment, which is performed at a temperature within 650–750° C. for 30–240 minutes, and thereafter a second thermal treatment, which is performed at a temperature within 900–1100° C. for 30–120 minutes, are performed as the initial thermal treatments on a semiconductor wafer composed of silicon. Further, before forming a gate insulating film, the temperature is increased to 1000° C. at a temperature increasing rate of 8° C./min in a nitrogen ambient, and a thermal treatment is performed at a temperature of 1000° C. for 30 minutes as a third thermal treatment.

5 Claims, 8 Drawing Sheets

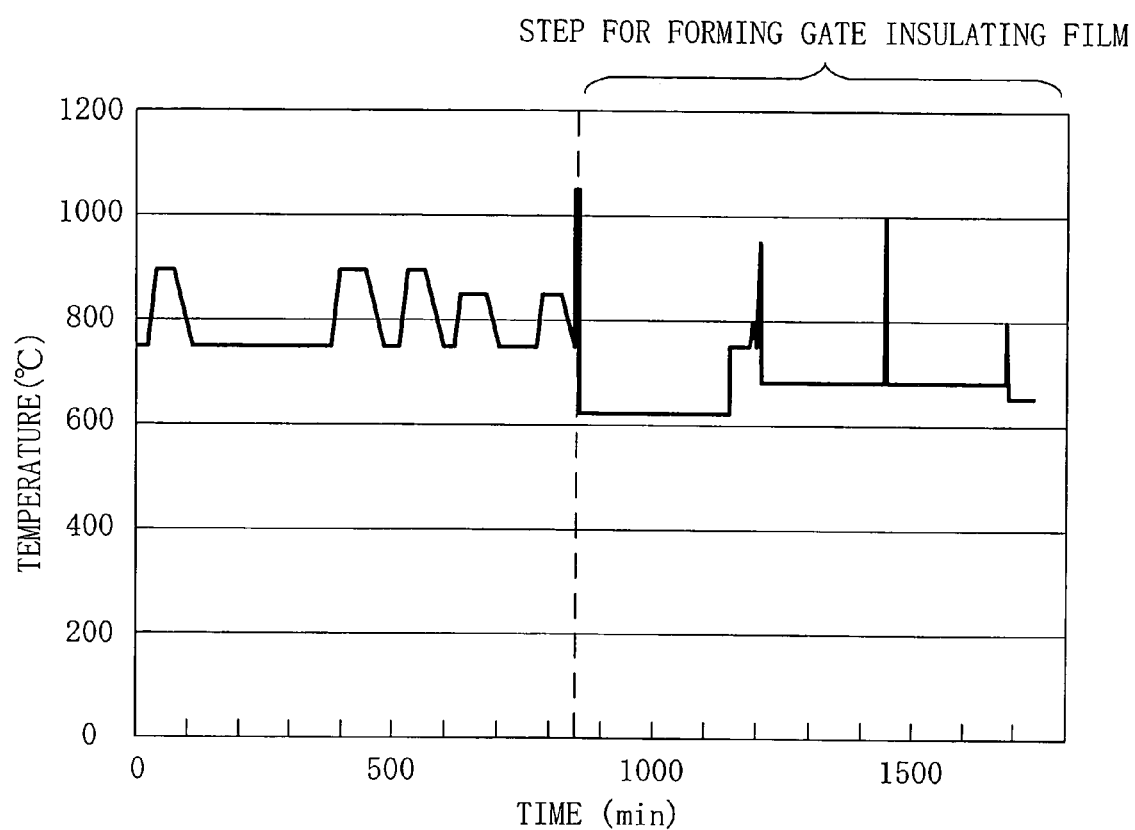

METHOD FOR FABRICATING SEMICONDUCTOR DEVICE AND SEMICONDUCTOR SUBSTRATE

BACKGROUND OF THE INVENTION

The present invention relates to methods for fabricating semiconductor devices, and semiconductor substrates. Particularly, the present invention relates to methods for fabricating semiconductor devices that prevent the decrease in reliability of components due to contamination of metal impurities during processing, and semiconductor substrates used in the semiconductor devices.

In recent years, together with the miniaturization of semiconductor components and the enlargement of semiconductor substrate (wafer), and due to the tendency of decreasing the diffusion length of impurities determining the conductivity type of semiconductor, or the prevention of the generation of thermal stress to wafers and the adverse effects to the electrical characteristics of the component caused by the application of thermal treatment, there is a tendency to decrease the temperature and the time of thermal treatment in a semiconductor fabricating process.

Generally, by sufficiently applying thermal treatment to the wafer, defects known as bulk microdefect (BMD) are generated due to the precipitation of oxygen in the lattices within the semiconductor substrate, and the BMD function as gettering sites. As a result, even if metal impurities generated during the fabricating process are deposited on the wafer, the deposited metal impurities are captured by the gettering sites, and thus the decrease in reliability of the gate insulating film and the like can be prevented. Such gettering capability of the BMD can be realized as long as the concentration of the BMD is approximately $1 \times 10^8$ cm$^{-3}$. However, in order to achieve such concentration of growth, generally, a thermal treatment of relatively high temperature for a relatively long period of time, such as a temperature of 1000° C. or more for a few hours, is required.

The conventional thermal treatment used in the method for fabricating semiconductor device that includes a step of forming a gate insulating film is described hereinafter.

FIG. 7 shows a typical thermal treatment performed on a device having, for example, a design rule of 0.15 μm. In the case where the wafer is made of silicon (Si), the thermal treatment shown in FIG. 7 is usually performed at a temperature of 900° C. for less than 100 minutes, and in the case where the temperature exceeded 1000° C., a rapid thermal processing (RTP) of 1 second to 30 seconds is performed. In such conventional thermal treatment, since the BMD cannot be sufficiently grown, the concentration of the BMD, which function as gettering sites, become $1 \times 10^6$ cm$^{-3}$ or less.

Moreover, in the case where a RTP is performed during the initial thermal treatment in the fabricating process, due to high increasing rate of temperature in the thermal treatment, the precipitation nuclei of the BMD within the wafer are dissolved and BMD growth cannot be achieved. Hence a sufficient gettering capability cannot be achieved in a miniature device process of which thermal budget is small, such that short period of thermal treatments such as RTP are intensively used and the temperature of the thermal treatment is relatively low. In other words, such process is extremely prone to metal contamination and the like. Here, the thermal budget refers to the amount of thermal treatment represented by the product of the temperature and the time for thermal treatment.

For example, problems such as the increase in current leakage due to metal contamination of the thinned gate insulating film composing the MOS (metal oxide semiconductor) transistor, and the decrease in reliability of the gate insulating film will occur.

In order to solve this problem, the thermal budget is increased by increasing the temperature and time period of the thermal treatment during the process. However, this in turn increases the diffusion length of the impurity ions that determine the conductivity type and fails to essentially solve the problem, thus becoming a serious problem in miniaturized CMOS (complementary metal oxide semiconductor) device.

Further, even if the precipitation nuclei of the gettering sites are formed in the silicon wafer, as shown in FIGS. 8A to 8C, other problems exist in the conventional high temperature annealing. For example, as shown in FIG. 8A, a wafer 100 composed of silicon having precipitation nuclei 101A of gettering sites composed of nitrogen, carbon, or oxygen is being prepared.

Next, as shown in FIG. 8B, annealing is performed approximately under a temperature of 1200° C. for 60 minutes to form gettering sites 101B composed of BMD, in which the precipitation nuclei 101A are grown, in a region several tens of μm from the surface of the wafer 100, and to form a Denuded Zone (DZ) 100a including no defects in the upper portion of the wafer 100.

However, as shown in FIG. 8C, the distance from the wafer surface to the gettering sites 101B is long, and metal impurities 110 having relatively small diffusion coefficient, such as iron (Fe), cannot be sufficiently diffused to the gettering sites 101B in a typical fabricating process, specifically in the thermal treatment within the miniaturized CMOS process.

SUMMARY OF THE INVENTION

The present invention aims to solve the aforementioned conventional problem. In a fabricating process in which a thermal budget is required to be reduced, a first object of the present invention is to form gettering sites for preventing metal impurities that affects a silicon wafer, and a second object of the present invention is to surely capture the metal impurities in the formed gettering sites.

In order to achieve the first object, a first method for fabricating a semiconductor device according to the present invention includes the steps of (a) performing a first thermal treatment at a temperature within 650–750° C. for 30–240 minutes; and (b) after the step (a), performing a second thermal treatment at a temperature within 900–1100° C. for 30–120 minutes, wherein the first and the second thermal treatments are the initial thermal treatments performed on a semiconductor substrate composed of silicon after the semiconductor substrate is introduced into a fabricating process.

According to the first method for fabricating the semiconductor device, after the semiconductor substrate composed of silicon is introduced into a fabricating process, precipitation nuclei of gettering sites are formed by the initial first thermal treatment and thereafter, the precipitation nuclei are grown to form the gettering sites by the second thermal treatment. Hence even if metal impurities are generated in the subsequent steps of the semiconductor device fabricating process, the metal impurities are captured by the gettering sites formed by the first and the second thermal treatments performed in the initial step of the fabricating process. As a result, the reliability of the semiconductor device can be maintained.

In the first method for fabricating the semiconductor device, it is preferable that the first thermal treatment and the second thermal treatment are both performed at a temperature increasing rate between 1–8° C./min, and a temperature decreasing rate between 1–60° C./min.

It is preferable that the first method for fabricating the semiconductor device further includes the steps of: (c) after the step (b), performing a third thermal treatment on the semiconductor substrate such that metal impurities are diffused to gettering sites, and (d) after the step (c), forming a gate insulating film on the principal surface of the semiconductor substrate.

Accordingly, since the third thermal treatment is performed on the semiconductor substrate such that metal impurities are diffused to the gettering sites, before forming the gate insulating film, metal contamination of the gate insulating film caused by the inability of the metal impurities, specifically metal impurities having a relatively small diffusion coefficient such as iron, to be diffused to the gettering sites in the step for forming the gate insulating film and the steps before thereof can be prevented, thus achieving the second object.

In this case, it is preferable that in the step (c), gettering sites composed of a bulk microdefect (BMD) layer are formed at a depth of 1–10 μm from the surface of the semiconductor substrate by the third thermal treatment, and the concentration of the gettering sites is between $5 \times 10^8$ cm$^{-3}$ and $5 \times 10^{10}$ cm$^{-3}$, inclusively.

In addition, it is also preferable that thermal budgets in the first thermal treatment, the second thermal treatment and the third thermal treatment are set within a range that maintains the characteristics of the semiconductor device.

A second method for fabricating a semiconductor device according to the present invention achieves the second object, and includes the steps of: (a) forming a gate insulating film on the principal surface of a semiconductor substrate composed of silicon; and (b) before forming the gate insulating film, performing a thermal treatment on the semiconductor substrate such that metal impurities are diffused to gettering sites.

According to the second method for fabricating the semiconductor device, the thermal treatment is performed on the semiconductor substrate such that the metal impurities are diffused to the gettering sites, before forming the gate insulating film. Hence, metal contamination of the gate insulating film that is easily affected by the metal impurities can be prevented, and thus the reliability of the semiconductor device can be maintained.

The invention of the first method for fabricating the semiconductor device resides in generating the gettering sites in advance in the semiconductor substrate in which no gettering site is generated. On the other hand, the invention of the second method for fabricating the semiconductor device resides in, under the assumption that the gettering sites are generated, preventing the diffusion of the metal impurities to the gettering sites in the step for forming the gate insulating film and the steps before thereof, so as to prevent the gate insulating film from metal contamination.

In the second method for fabricating the semiconductor device, it is preferable that gettering sites composed of a bulk microdefect (BMD) layer are formed at a depth of 1–10 μm from the surface of the semiconductor substrate by the thermal treatment, and the concentration of the gettering sites is between $5 \times 10^8$ cm$^{-3}$ and $5 \times 10^{10}$ cm$^{-3}$, inclusively.

A first semiconductor substrate according to the present invention achieves the first and the second objects, is composed of silicon, and has gettering sites composed of a bulk microdefect (BMD) layer formed at a predetermined depth from the surface of the semiconductor substrate by performing initial thermal treatments on the semiconductor substrate, the initial thermal treatments including a first thermal treatment performed at a temperature within 650–750° C. for 30–240 minutes and a second thermal treatment performed at a temperature within 900–1100° C. for 30–120 minutes after the first thermal treatment, wherein the predetermined depth is smaller than or equal to a diffusion distance of metal impurities to the gettering sites.

According to the first semiconductor substrate, the first and the second thermal treatments according to the first method for fabricating the semiconductor device of the present invention are performed on the semiconductor substrate as the initial thermal treatments. Hence even if the thermal treatment is a thermal treatment performed in a miniaturizing process such as a relatively low temperature thermal treatment or a thermal treatment by RTP, since the gettering sites are generated before the commencing of the process, metal contamination can be prevented. As a result, the reliability of the semiconductor device fabricated by using such semiconductor substrate can be maintained.

A second semiconductor substrate according to the present invention achieves the first and the second objects, is composed of silicon, on which top surface an epitaxial layer having a predetermined thickness is formed, and has gettering sites composed of a bulk microdefect (BMD) layer formed below the epitaxial layer by performing initial thermal treatments on the semiconductor substrate, the initial thermal treatments including a first thermal treatment performed at a temperature within 650–750° C. for 30–240 minutes and a second thermal treatment performed at a temperature within 900–1100° C. for 30–120 minutes after the first thermal treatment, wherein the thickness of the epitaxial layer is smaller than or equal to a diffusion distance of metal impurities to the gettering sites.

According to the second semiconductor substrate, the epitaxial layer is formed on the top surface of the semiconductor substrate, and the thickness of the epitaxial layer is set at smaller than or equal to the diffusion distance of the metal impurities to the gettering sites. Hence by performing the first and the second thermal treatments, as the initial thermal treatments performed on the semiconductor substrate, according to the first method for fabricating the semiconductor device of the present invention, contamination due to the metal impurities generated during the fabricating process can be prevented. As a result, the reliability of the semiconductor device fabricated by using such semiconductor substrate can be maintained.

A third semiconductor substrate according to the present invention achieves the second object, is composed of silicon, and has gettering sites composed of a bulk microdefect (BMD) layer at a predetermined depth from the surface of the semiconductor substrate, wherein the predetermined depth is smaller than or equal to a diffusion distance of metal impurities to the gettering sites.

A fourth semiconductor substrate according to the present invention achieves the second object, is composed of silicon, on which principal surface an epitaxial layer having a predetermined thickness is formed, and has gettering sites composed of a bulk microdefect (BMD) layer below the epitaxial layer, wherein the thickness of the epitaxial layer is smaller than or equal to a diffusion distance of metal impurities to the gettering sites.

BRIEF DESCRIPTION OF THE DRAWINGS

FIG. 7 is a sequence chart showing a typical thermal treatment for a device having a gate insulating film, and under a conventional design rule of 0.15 µm.

DETAILED DESCRIPTION OF THE INVENTION

FIRST EMBODIMENT

Hereinafter, the first embodiment of the present invention is described.

In the first embodiment, a wafer (not shown in drawing) made of p-type silicon (Si) and having a principal surface of plane orientation (100) is used. The wafer has a resistivity of 10 Ωcm–15 Ωcm, and an oxygen concentration of $12.5 \times 10^{17}$ atoms·cm$^{-3}$ according to the ASTM' 79 standard. An epitaxial layer having a thickness of 3 µm and resistivity of 11 Ωcm–14 Ωcm is formed on the principal surface of the wafer. Here, the ASTM refers to the American Society for Testing and Materials.

During the formation of the wafer using Czochralski Growth (Cz) method, nitrogen atoms having a concentration of $5 \times 10^3$ atoms cm$^{-3}$ are added. However, the BMD of the wafer is not measured before the wafer is sent to the fabricating process. A thermal treatment shown in FIG. 1 is performed on such wafer before fabricating a semiconductor device.

Figure 1:
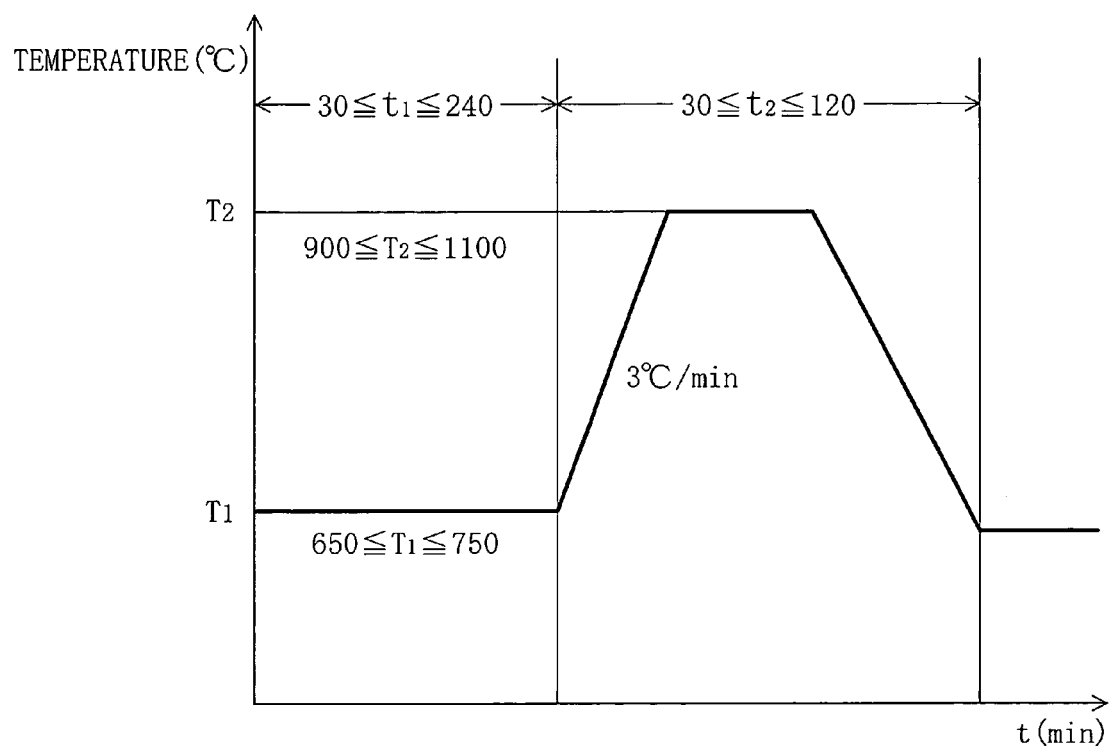
FIG. 1 is a sequence chart showing thermal treatments performed before commencing a process in a method for fabricating a semiconductor device according to a first embodiment of the present invention.

Accordingly, a thermal treatment having a sequence according to the first embodiment of the present invention shown in FIG. 1 is performed on a wafer before the start of the process, thereby forming BMD having a sufficient concentration of $5 \times 10^8$ cm or more as gettering sites.

Hereinafter, the thermal treatment according to the first embodiment of the present invention is described in details with reference to FIG. 1.

As shown in FIG. 1, firstly, a first thermal treatment is performed with a temperature $T_1$ of 700° C. for a time period $t_1$ of 120 minutes in a nitrogen ambient. The temperature is increased at a rate of 3° C./min in the nitrogen ambient until it reaches 1000° C., and thereafter, a second thermal treatment is performed at a temperature $T_2$ of 1000° C. for a time period $t_2$ of 60 minutes. However, the second thermal treatment is not necessary to be performed continuously after the first thermal treatment.

The first thermal treatment is performed at a relatively low temperature because precipitation nuclei, which precipitate oxygen in the lattices, are generated by thermal treatment having a temperature under which oxygen in the lattices of the silicon composing the wafer become easily supersaturated. The temperature for such thermal treatment is not limited to 700° C., but can also be a temperature between 650° C. and 750° C. Although the lower and the upper temperature limits for generating the precipitation nuclei are 600° C. and 800° C. respectively, the temperature range for effectively generating precipitation nuclei is between 650° C. and 750° C.

Further, although the time period $t_1$ for the thermal treatment can be longer than 120 minutes, it is kept between 30 minutes and 240 minutes in consideration of productivity. Here, although the upper limit is set at 240 minutes, there is no advantage or disadvantage with regard to the precipitation nuclei generation even if the first thermal treatment is performed for more than 4 hours.

As described above, a low reactive nitrogen gas is used in the thermal ambient. Accordingly, oxygen is easily precipitated in the silicon crystal by adding nitrogen into the silicon crystal. In addition, oxygen can also be easily precipitated by adding carbon, as a substitute of nitrogen, into the silicon crystal. Moreover, the effect of generating the precipitation nuclei can be increased by simultaneously adding carbon and nitrogen, and BMD having sufficient concentration can also be formed. The temperature for effective generation of precipitation nuclei in the case where carbon is added into the wafer is between 650° C. and 750° C.

While shifting from the first thermal treatment to the second thermal treatment, the temperature is required to be increased relatively gently such that the rate at which the precipitation nuclei dissolve is not higher than the rate at which the precipitation nuclei grow. Here, the increasing rate of the temperature is set at 3° C./min, but the rate can be between 1° C./min and 8° C./min.

The precipitation nuclei are annihilated when the dissolving rate is higher than the growth rate. The aforementioned RTP will certainly cause the dissolving rate of the precipitation nuclei to be higher than the growth rate. The second thermal treatment is performed at a relatively high temperature of 1000° C., and thereby greatly growing the precipitation nuclei as BMD, and increasing the effect of the precipitation nuclei as gettering sites.

The second thermal treatment is also performed before the start of the process, and the temperature of the second thermal treatment can be between the range of 900° C. and 1100° C. Here, in consideration of the thermal stress in a wafer with a large diameter, the temperature $T_2$ is set at 1000° C. and the time period $t_2$ is set at 60 minutes. Due to such second thermal treatment, the BMD is greatly grown and possess a high gettering ability.

Thereafter, the temperature $T_2$ is decreased at a decreasing rate of between 1° C./min and 60° C./min, and after the wafer is being removed from the chamber, a step for forming pad oxide film, which is the initial step of the fabricating process, is performed.

Since BMD of concentration $5 \cdot 10^8$ cm$^{-3}$ are already formed in the wafer according to the first embodiment before the step for forming pad oxide film, the wafer possesses sufficient gettering ability. The upper limit of the concentration of BMD is preferred to be $5 \times 10^{10}$ cm$^{-3}$, because if the concentration is more than the upper limit, the growth of dislocation in the periphery of the BMD becomes obvious and the mechanical strength of the silicon crystal, thus wafer, deteriorates.

Hence according to the first embodiment, since a two-stages thermal treatment including the first and the second thermal treatments is performed before the wafer is shifted to the semiconductor fabricating process, problem such as the increase in diffusion length of the impurity ions determining the conductivity type is completely prevented, and a stable gettering ability independent of the thermal treatment performed in the process thereafter can be maintained.

MODIFICATION OF FIRST EMBODIMENT

Hereinafter, the modification of the first embodiment of the present invention is described with reference to the drawing.

Figure 2:
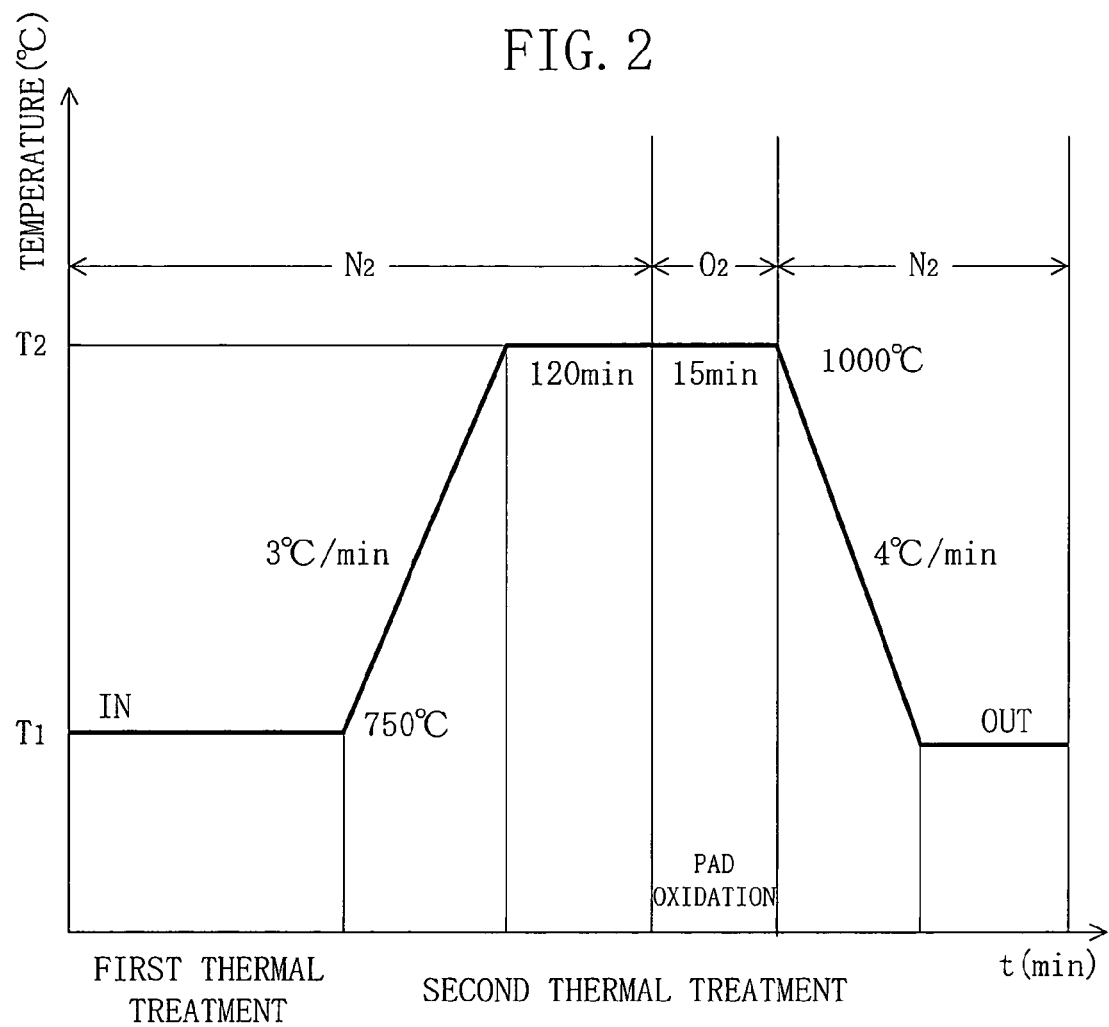
FIG. 2 is a sequence chart showing thermal treatments performed in a method for fabricating a semiconductor device according to the modification of the first embodiment of the present invention.

FIG. 2 shows a sequence chart of thermal treatments in a method for fabricating a semiconductor device according to the modification of the first embodiment related to the present invention.

Generally, the initial thermal treatment in a semiconductor process performed on a wafer is usually an oxidizing step, or specifically a pad oxidizing step.

As shown in FIG. 2, the second thermal treatment performed before the actual process of the present invention is a thermal treatment sequence incorporating the pad oxidizing step initially performed in the process. Since the pad oxidizing step, which is performed at a temperature of 1000° C. for 15 minutes in an oxygen ambient, is incorporated into the second thermal treatment of the present invention, even if the thermal treatment performed on the wafer is a relatively low temperature process, the gettering ability can be maintained without increasing the process steps.

SECOND EMBODIMENT

Hereinafter, the second embodiment of the present invention is described with reference to the drawings.

According to the first embodiment, since no gettering site is formed in a process having small thermal budget such as that shown in FIG. 7, BMD having concentration that is possible for gettering are formed before shifting to the actual process.

Even though BMD having sufficient concentration can be formed in the wafer as gettering sites before performing the actual process, metal species, which are required for the thermal treatment to generate sufficient diffusion for capturing metal impurities, exist in the BM.

Further, even though gettering sites composed of BMD and the like exist in high concentration, if the metal impurities fail to migrate to the gettering sites or the metal impurities migrating to the gettering sites are not captured in the gettering sites, the gettering effect is not achieved.

In the case where the metal impurities are composed of metal such as copper (Cu) or nickel (Ni), the diffusion coefficient within the silicon is relatively large. Hence, even if the thermal treatment is performed at a relatively low temperature and for a relatively short period of time, the metal impurities in a element forming layer (active layer) formed on the surface of the wafer can be sufficiently migrated to the gettering sites composed of BMD by diffusion. However, in the case where the metal impurities are composed of iron (Fe), the diffusion coefficient within the silicon may not be large. Hence, even if the BMD are formed in a region below the active layer, a thermal treatment having a relatively large thermal budget, as compared to the case of copper and nickel, is required for the iron atoms to migrate to the region below the active layer by diffusion.

In the second embodiment, a thermal treatment that can sufficiently diffuse metal impurities having a relatively small diffusion coefficient such as iron to the gettering sites is performed before forming an insulating film that is extremely easily affected by the contamination of the metal impurities.

Figure 3:
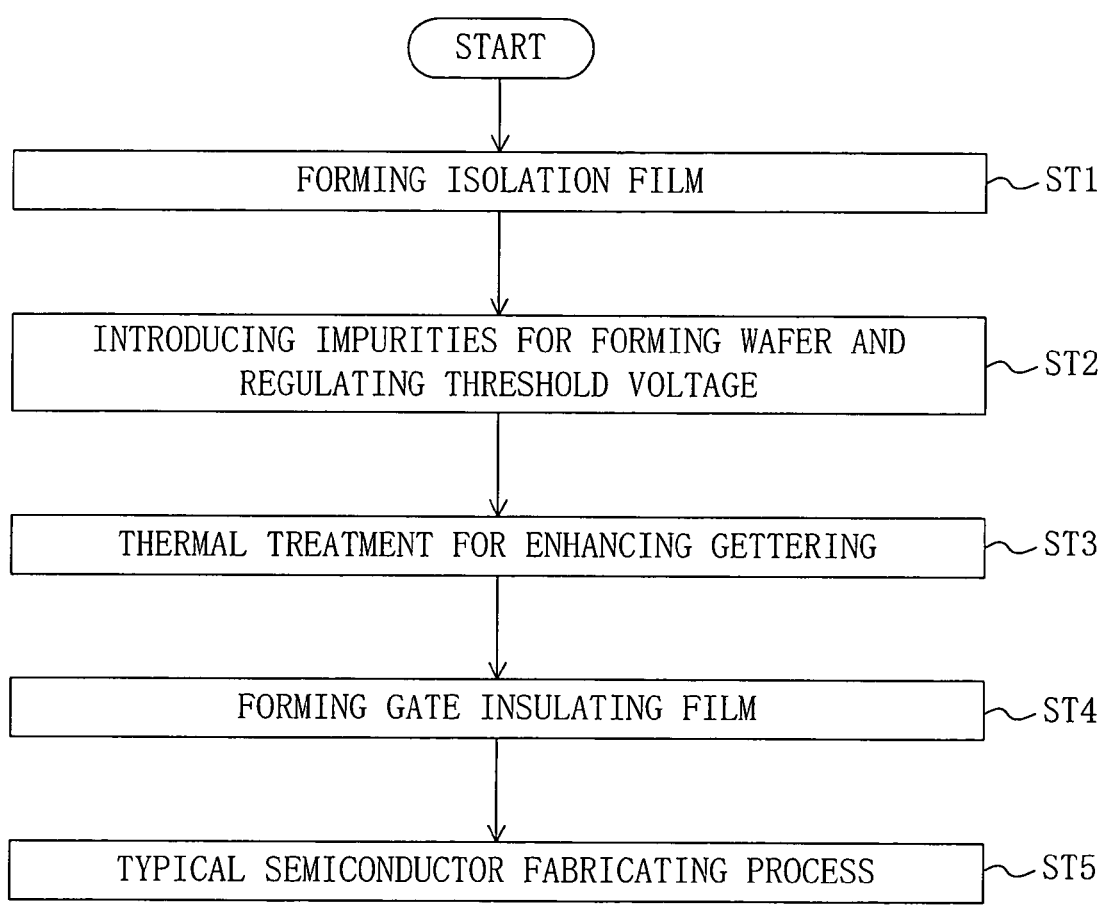
FIG. 3 is a flow chart of a process including a step for forming a gate insulating film in a method for fabricating a semiconductor device according to a second embodiment of the present invention.

FIG. 3 illustrates a process flow including a step for forming a gate insulating film in a method for fabricating a semiconductor device according to the second embodiment of the present invention.

As shown in FIG. 3, a generally known isolation film composed of, for example, shallow trench isolation (STI) and the like is selectively formed on the principal surface of the wafer in the step ST1.

Next, in the step ST2, a p-type well is formed in an element forming region partitioned by the isolation film on the principal surface of the wafer by, for example, selectively ion implanting p-type impurities. Subsequently, for example, p-type impurities for regulating the threshold voltage of the MOS transistor are implanted.

Figure 4:
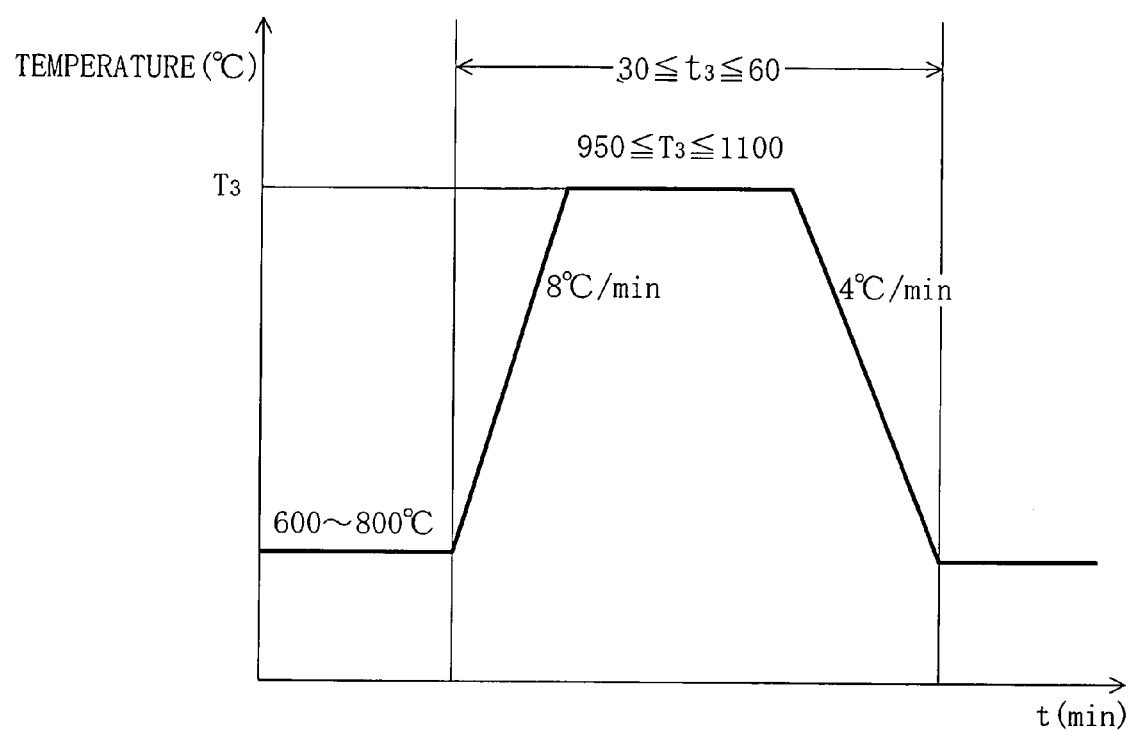
FIG. 4 is a sequence chart showing a thermal treatment for enhancing gettering before forming a gate insulating film in a method for fabricating a semiconductor device according to the second embodiment of the present invention.

The thermal treatment of the present invention for enhancing the gettering effect is performed in the step ST3. The sequence of the thermal treatment for enhancing gettering is shown in FIG. 4. As shown in FIG. 4, before forming a gate insulating film, temperature is increase to 1000° C. at an increasing rate of 8° C./min in nitrogen ambient, and a thermal treatment is performed at a temperature $T_3$ of 1000° C. for a time period $t_3$ of 30 minutes. Thereafter, the temperature is decreased at a decreasing rate of, for example, 4° C./min.

In the step ST4, a generally known cleaning is performed on the wafer of which gettering effect is enhanced, and thereafter, the cleaned wafer is introduced into a RTP device and the gate insulating film composed of silicon oxide and having a thickness of 2.8 nm is formed at a temperature of 1050° C. and under a pressure of 600×133.322 Pa, using nitrogen monoxide in an oxidizing gas.

In the step ST5, a CMOS device is formed according to a typical MOS semiconductor process.

Here, although a RTP device is used in forming the gate insulating film, an electric furnace can also be used. Moreover, the thermal treatment temperature can be set at any appropriate values, and oxygen ($O_2$), steam ($H_2O$) or the like can be appropriately selected for the oxidizing ambient.

Generally, before the forming of the gate insulating film, only the step for implanting impurities for regulating the threshold voltage of the transistor is performed, and the regulation of the threshold voltage, which is required for applying the thermal treatment of 1000° C. after the step ST2, is not difficult. Moreover, the range of the temperature $T_3$ can be between 950° C.–1100° C.

Even if the metal impurities are iron, the temperature $T_3$ depends on and is determined by the depth from the wafer surface in the gettering sites composed of BMD, and if the BMD are provided in a shallow location, a lower temperature thermal treatment is possible.

In the second embodiment, even though gettering sites are formed in the wafer, in order to capture the metal impurities having a relatively smaller diffusion coefficient such as iron in the gettering sites, a thermal budget larger than that of the case in which metal impurities such as copper are used is required. Accordingly, before the step ST4 for forming the gate insulating film required for the thinning of the film corresponding to the miniaturized design rule of 0.15 µm, the thermal treatment shown in the step ST3 is applied to supply sufficient thermal budget for diffusing the metal impurities having a relatively small diffusion coefficient such as iron to the gettering sites. Hence, in a step for forming a part that is easily affected by the metal impurities such as, for example, a gate insulating film of a MOS transistor, metal impurities having a relatively small diffusion coefficient such as iron can also be surely captured in the gettering sites. As a result, the MOS semiconductor device, or specifically the reliability of the CMOS semiconductor device can be greatly increased.

THIRD EMBODIMENT

Hereinafter, the third embodiment of the present invention is described with reference to the drawings.

As described above, in order to diffuse metal impurities having a relatively large diffusion coefficient such as copper and nickel to the gettering sites, a thermal treatment of relatively low temperature or short period of time is required. However, with respect to metal impurities having a relatively small diffusion coefficient such as iron, a thermal treatment of relatively higher temperature and longer period of time is required. In addition, the semiconductor process, specifically the thermal budget that can be applied to the semiconductor device for fabrication, so that the allowable thermal treatment is not exceeded, also required to be considered.

In the third embodiment, a wafer with gettering sites having determined depth is achieved by the thermal treatment required for diffusing the metal impurities having a relatively small diffusion coefficient to the gettering sites composed of BMD.

In other words, the feature of the wafer according to the present embodiment resides in that the depth of the BMD from the surface is determined by the thickness of an epitaxial layer formed on the wafer. Hence, the BMD are formed in a location corresponding to the thermal budget in the entire process.

Generally, the allowable range of the thermal budget after forming the gate insulating film and before forming the source/drain region is relatively wide, even in a miniaturized device. Once the source/drain region or the impurities region having a relatively high concentration such as the LDD structure is formed, the change in characteristic of the semiconductor device due to the diffusion length becomes prominent. Specifically, after the forming of the gate insulating film, a strict thermal budget is required for the additional thermal treatment after the forming of the source/drain region. On the other hand, in the step of forming the gate insulating film, the diffusion layer is the well region and the channel region, which are a diffusion region having a relatively low concentration; and in the case of such diffusion region having low concentration of impurities, the thermal budget is not as strict as in the source/drain region.

At least in the case of a MOS device having a design rule smaller than 0.15 µm, generally, the temperature required for the thermal treatment performed after forming the source/drain region is between 600° C. and 700° C. Further, in the case where a high temperature thermal treatment of temperature exceeding 800° C. is required, a thermal treatment with a short time period is performed by RTP. Hence, it is not appropriate to form the BMD after the forming of the source/drain region, and the step of forming the gate insulating film is completed.

On the other hand, the upper limit of the temperature in the step after the forming of the well and before the forming of the gate insulating film is approximately 1000° C., and the time period is approximately 60 minutes. The concentration of the well and the impurities profile of the channel can be adjusted for the thermal treatment before the step of forming the gate insulating film. However, there is a limit in performing a thermal treatment at a significantly high temperature for a significantly long period, and a thermal treatment performed at approximately 1000° C. for 60 minutes is the limit. With regard to this, before forming the well region, since no impurities is introduced into the wafer, there is a larger freedom in the thermal budget as long as no thermal treatment with high temperature and long period of time, such that will generate crystal defects in the wafer, is performed. However at this point, since the gate insulating film is not yet formed, diffusion of contaminant metal to the BMD region cannot be carried out even though it contributes to the forming of the BMD.

Hereinafter, specific examples are described.

Figure 5A:
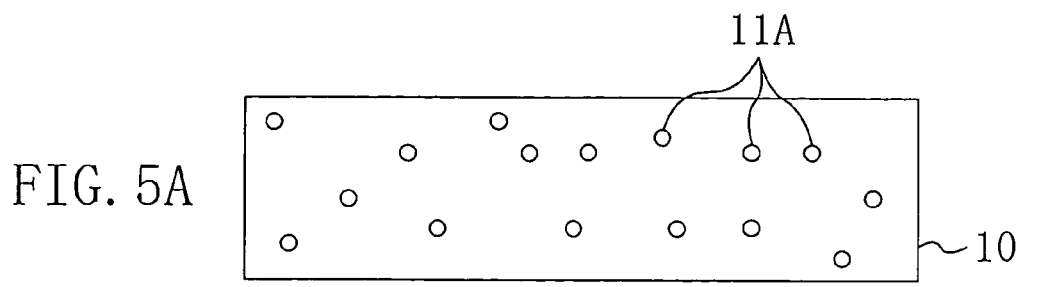
FIGS. 5A–5D are cross-sectional schematic illustrations showing the sequence of a method for fabricating a semiconductor substrate (wafer) according to a third embodiment of the present invention.
Figure 5B:
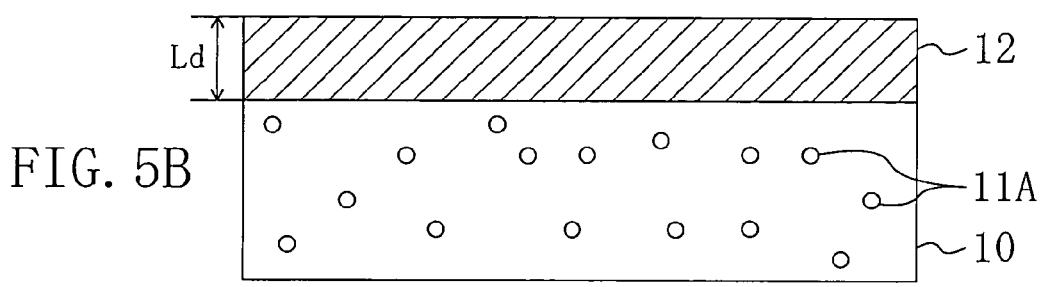
Figure 5C:
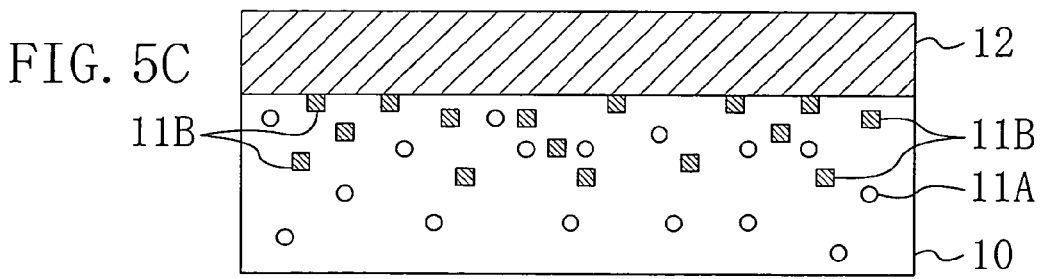
Figure 5D:
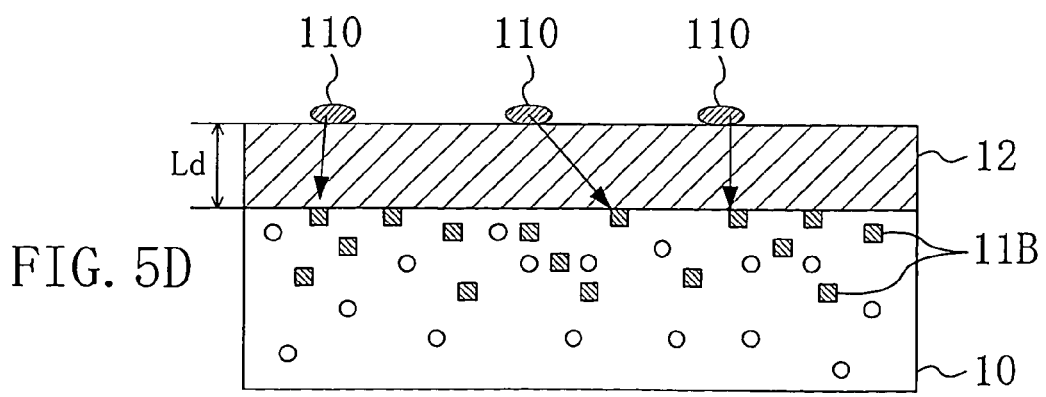
Figure 6:
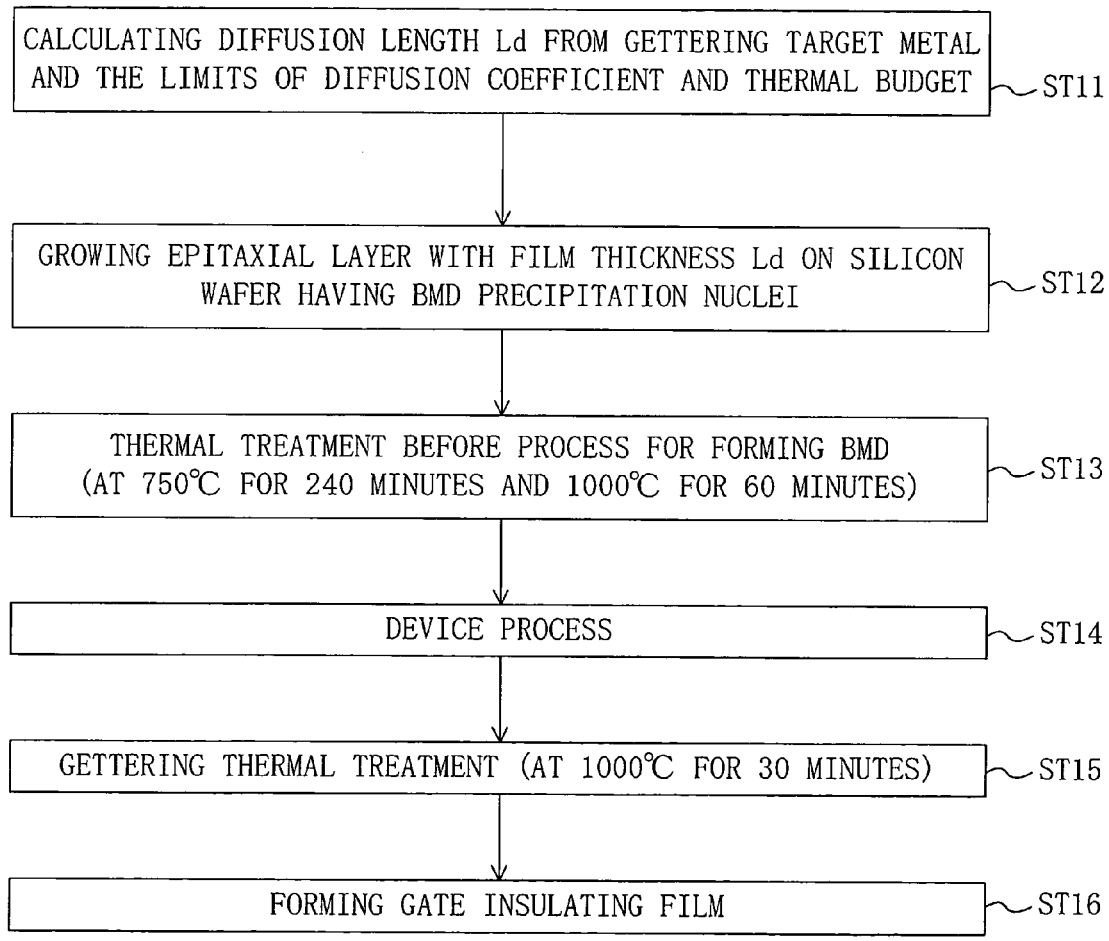
FIG. 6 is a flow chart showing a process of a method for fabricating a semiconductor device according to the third embodiment.
Figure 8A:
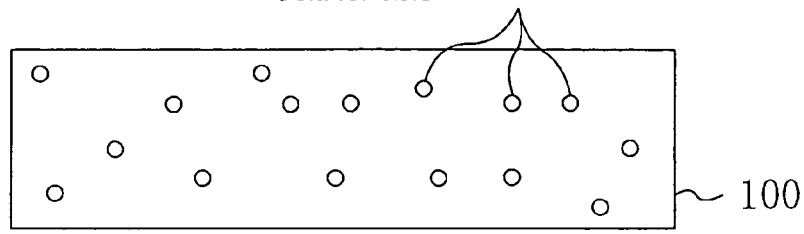
FIGS. 8A–8C are cross-sectional schematic illustrations showing the sequence of thermal treatments for forming gettering sites and a no-defect layer in a conventional semiconductor substrate (wafer).
Figure 8B:
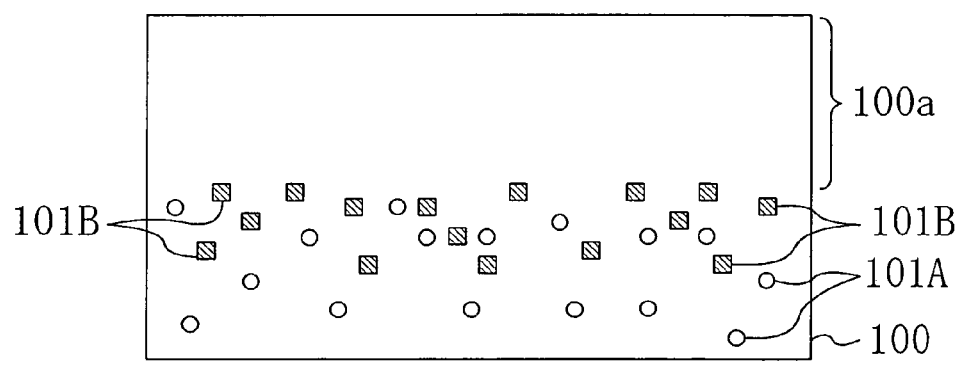
Figure 8C:
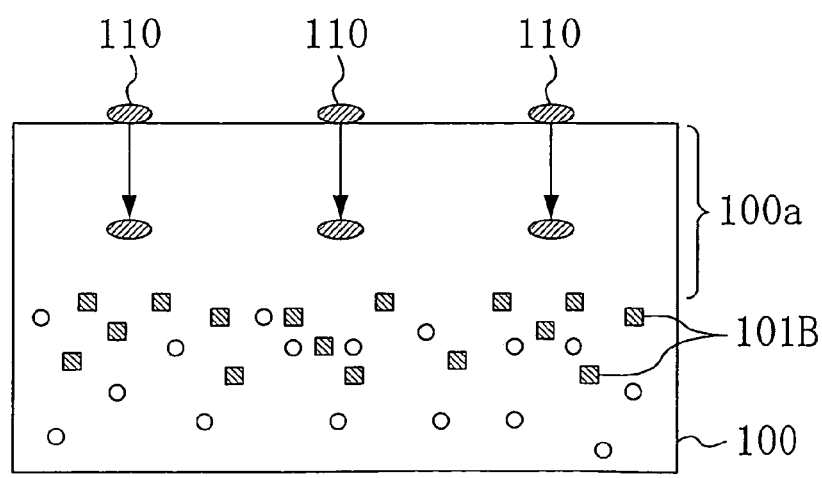

FIG. 5 illustrates cross-sectional diagrams of a method for fabricating a semiconductor substrate (wafer) according to the third embodiment of the present invention, and FIG. 6 shows the flow of a method for fabricating a semiconductor device using the semiconductor substrate.

Firstly, as shown in FIG. 5A, a wafer 10 composed of a p-type silicon doped with boron (B) and having a resistivity of between 10 Ωcm and 15 Ωcm, and an oxygen concentration of $14.0 \times 10^{17}$ atoms $cm^{-3}$ according to the ASTM'79 standard, is prepared. When the wafer 10 is formed by Cz method, nitrogen atoms that function as precipitation nuclei 11A of gettering sites are added at a concentration of $5 \times 10^{13}$ atoms $cm^{-3}$. Here, the wafer 10 is a substrate used for fabricating a MOS device having a gate insulating film as a component.

Next, as shown in the step ST11 of FIG. 6, the diffusion length Ld (=2 µm) of the gettering sites from the surface of the wafer is calculated from a thermal treatment required for forming a gate insulating film, a thermal budget allowed by the electrical characteristic of the device, and the subject to be captured, for example, metal impurities having a relatively small diffusion coefficient such as iron.

As shown in FIG. 5B and the step ST12 of FIG. 6, an epitaxial layer 12 doped with boron, having a resistivity of between 11 Ωcm and 14 Ωcm, and composed of silicon having a thickness of 2 µm, which is the same as the calculated diffusion length, is formed on the principal surface of the wafer 10 by, for example, a Chemical Vapor Deposition (CVD) method.

As shown in FIG. 5C and the step ST13 of FIG. 6, before starting a fabricating process, according to the present invention, a first thermal treatment is performed at a temperature of 750° C. for 120 minutes in a nitrogen ambient, and thereafter the temperature is increase to 1000° C. at a temperature increasing rate of 3° C./min and a second thermal treatment is performed at a temperature of 1000° C. for 60 minutes.

Accordingly, the parameters of the first and the second thermal treatments and the value of the diffusion length Ld of the metal impurities are calculated from the diffusion length of the metal impurities, specifically iron, such that gettering sites 11B composed of BMD are formed in the location in which gettering of iron can be carried out sufficiently.

Next, as shown in the step ST14 of FIG. 6, a typical device process in which forming of isolation film, ion implantations for forming well and for regulating threshold voltage are respectively performed, is performed on the wafer 10 on which the epitaxial layer 12 and in which the gettering sites 11B are formed. This corresponds to the steps ST1 and ST2 in FIG. 3 of the second embodiment.

As shown in the step ST15 of FIG. 6, a third thermal treatment is performed at a temperature of 1000° C. for 30 minutes to enhance gettering. This corresponds to the step ST3 in FIG. 3 of the second embodiment. Due to the third thermal treatment, as shown in FIG. 5D, even the metal impurities 110, which have a relatively small diffusion coefficient such as iron, are captured by the gettering sites 11B located directly below the epitaxial layer 12.

As shown in the step ST16 of FIG. 6, a gate insulating film (not shown in drawing) composed of oxidized silicon is formed in the upper portion of the epitaxial layer 12 by thermal oxidation. This corresponds to the step ST4 in FIG. 3 of the second embodiment.

As described above, according to the third embodiment, the diffusion length Ld of the metal impurities is calculated from the thermal treatment performed by all the processes including the gate insulating film, the allowable range of the thermal treatment for enhancing the gettering, and the diffusion coefficient of the metal impurities that are the gettering subjects. In addition, the epitaxial layer 12 having a thickness smaller than or the same as the diffusion length Ld is formed on the principal surface of the wafer 10, thereby forming the wafer 10 in which the gettering sites 11B exist directly below the epitaxial layer 12.

Under such condition, the first and the second thermal treatments of the present invention are performed to generate the gettering sites 11B such as the BMD. Thereafter, the third thermal treatment of the present invention for enhancing the gettering before the forming of the gate insulating film is performed, so that the metal impurities can be captured by the gettering sites 11B located directly below the epitaxial layer 12. Hence, a MOS device including a highly reliable gate insulating film can be formed.

As described above, the method for fabricating the semiconductor device and the semiconductor substrate of the present invention have the effect of maintaining the reliability of the semiconductor device by capturing the metal impurities generated during the fabricating process with the gettering sites formed in advance. In other words, the method for fabricating the semiconductor device and the semiconductor substrate of the present invention are good for fabricating a semiconductor device having a CMOS device or a gate insulating film such as an image pickup device including charge-coupled device or MOS image sensor, and a semiconductor substrate (wafer) used in such semiconductor device.

What is claimed is:

1. A semiconductor substrate composed of silicon, the semiconductor substrate having gettering sites composed of a bulk microdefect (BMD) layer formed at a predetermined depth from the surface of the semiconductor substrate by performing initial thermal treatments on the semiconductor substrate, but having no Denuded Zone (DZ) in an upper portion thereof, the initial thermal treatments including a first thermal treatment performed at a temperature within 650–750° C. for 30–240 minutes and a second thermal treatment performed at a temperature within 900–1100° C. for 30–120 minutes after the first thermal treatment, wherein the predetermined depth is smaller than or equal to a diffusion distance of metal impurities to the gettering sites.

2. A semiconductor substrate composed of silicon, the semiconductor substrate on which top surface an epitaxial layer having a predetermined thickness is formed, the semiconductor substrate, on which the epitaxial layer is formed, having gettering sites composed of a bulk microdefect (BMD) layer formed below the epitaxial layer by performing initial thermal treatments on the semiconductor substrate, the initial thermal treatments including a first thermal treatment performed at a temperature within 650–750° C. for 30–240 minutes and a second thermal treatment performed at a temperature within 900–1100° C. for 30–120 minutes after the first thermal treatment, wherein nitrogen atoms that function as precipitation nuclei of the gettering sites are added to the semiconductor substrate, and the thickness of the epitaxial layer is smaller than or equal to a diffusion distance of metal impurities to the gettering sites.

3. A semiconductor substrate composed of silicon, the semiconductor substrate having gettering sites composed of a bulk microdefect (BMD) layer at a predetermined depth from the surface of the semiconductor substrate, but having no Denuded Zone (DZ) in an upper portion thereof, wherein the predetermined depth is smaller than or equal to a diffusion distance of metal impurities to the gettering sites.

4. A semiconductor substrate composed of silicon, the semiconductor substrate on which principal surface an epitaxial layer having a predetermined thickness is formed, and having gettering sites composed of a bulk microdefect (BMD) layer below the epitaxial layer, wherein nitrogen atoms that function as precipitation nuclei of the gettering sites are added to the semiconductor substrate, and the thickness of the epitaxial layer is smaller than or equal to a diffusion distance of metal impurities to the gettering sites.

5. A method for fabricating a semiconductor device comprising the steps of:

(a) performing a first thermal treatment at a temperature within 650–750° C. for 30–240 minutes; and (b) after the step (a), performing a second thermal treatment at a temperature within 900–1100° C. for 30–120 minutes, wherein the first and the second thermal treatments are a sequence of thermal treatments initially performed on a semiconductor substrate composed of silicon after the semiconductor substrate is introduced into a fabricating process, and the first and the second thermal treatments are performed seciuentially in the same heating apparatus, and wherein in the step (b), gettering sites composed of a bulk microdefect (BMD) layer are formed at a predetermined depth from the surface of the semiconductor substrate, but no Denuded Zone (DZ) is formed in an upper portion of the semiconductor substrate.

* * * * *